United States Patent
Kozakai et al.

(10) Patent No.: US 11,454,878 B2
(45) Date of Patent: Sep. 27, 2022

(54) SUBSTRATE WITH MULTILAYER REFLECTIVE FILM, REFLECTIVE MASK BLANK, REFLECTIVE MASK AND METHOD OF MANUFACTURING SEMICONDUCTOR DEVICE

(71) Applicant: HOYA CORPORATION, Tokyo (JP)

(72) Inventors: Hirofumi Kozakai, Tokyo (JP); Takahiro Onoue, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 357 days.

(21) Appl. No.: 16/625,569

(22) PCT Filed: Jun. 14, 2018

(86) PCT No.: PCT/JP2018/022756
§ 371 (c)(1),
(2) Date: Dec. 20, 2019

(87) PCT Pub. No.: WO2018/235721
PCT Pub. Date: Dec. 27, 2018

(65) Prior Publication Data
US 2021/0247688 A1 Aug. 12, 2021

(30) Foreign Application Priority Data
Jun. 21, 2017 (JP) .............................. JP2017-121485

(51) Int. Cl.
*H01L 21/44* (2006.01)
*G03F 1/24* (2012.01)
(Continued)

(52) U.S. Cl.
CPC .................. *G03F 1/24* (2013.01); *G03F 1/58* (2013.01); *H01L 21/0332* (2013.01); *H01L 21/0337* (2013.01)

(58) Field of Classification Search
CPC ... H01L 21/0332; H01L 21/0337; G03F 1/24; G03F 1/58; G03F 7/70958; G21K 1/067
(Continued)

(56) References Cited

U.S. PATENT DOCUMENTS

| 6,309,705 B1 | 10/2001 | Montcalm et al. |
| 2006/0192147 A1 * | 8/2006 | Kandaka ................ G21K 1/062 250/492.1 |

(Continued)

FOREIGN PATENT DOCUMENTS

| EP | 1675164 A1 | 6/2006 |
| JP | 2005-250187 A | 9/2005 |

(Continued)

OTHER PUBLICATIONS

SG11201911415V, "Invitation to Respond to Written Opinion", dated Dec. 9, 2020, 8 pages.

(Continued)

*Primary Examiner* — Brook Kebede
(74) *Attorney, Agent, or Firm* — Kilpatrick Townsend & Stockton LLP

(57) ABSTRACT

Provided is a substrate with multilayer reflective film used to manufacture a reflective mask having a multilayer reflective film having high reflectance with respect to exposure light and little film stress. The substrate with multilayer reflective film is provided with a multilayer reflective film for reflecting exposure light, the substrate with multilayer reflective film comprising a multilayer film obtained by building up an (Continued)

alternating stack of low refractive index layers and high refractive index layers on a substrate, and the multilayer reflective film contains krypton (Kr).

19 Claims, 4 Drawing Sheets

(51) Int. Cl.
*G03F 1/58* (2012.01)
*H01L 21/033* (2006.01)
(58) Field of Classification Search
USPC .......................................................... 438/686
See application file for complete search history.

(56) References Cited

U.S. PATENT DOCUMENTS

| | | | |
|---|---|---|---|
| 2007/0077499 A1 | 4/2007 | Ikuta et al. | |
| 2014/0227635 A1* | 8/2014 | Kim | G03F 1/24 430/5 |
| 2014/0302429 A1 | 10/2014 | Shoki et al. | |
| 2016/0202601 A1 | 7/2016 | Onoue | |
| 2016/0377769 A1 | 12/2016 | Hamamoto et al. | |
| 2019/0187551 A1 | 6/2019 | Iwashita et al. | |

FOREIGN PATENT DOCUMENTS

| | | | |
|---|---|---|---|
| JP | 2009-510711 | A | 3/2009 |
| JP | 2012-203201 | A | 10/2012 |
| JP | 2014-229825 | A | 12/2014 |
| JP | 2017-116931 | A | 6/2017 |
| SG | 11201901301 | S | 3/2019 |
| TW | 201344342 | A | 11/2013 |
| TW | 201512784 | A | 4/2015 |
| TW | 201523120 | A | 6/2015 |
| WO | 2005/038886 | A1 | 4/2005 |
| WO | 2018/037864 | A1 | 3/2018 |

OTHER PUBLICATIONS

JP2019-525523, "Notice of Reasons for Refusal with Machine Translation", dated Jan. 4, 2022, 5 pages.
PCT/JP2018/022756, English Translation of International Search Report dated Sep. 4, 2018.
TW107121261, "Office Action", dated Feb. 10, 2022, 5 pages.

* cited by examiner

SUBSTRATE WITH MULTILAYER REFLECTIVE FILM, REFLECTIVE MASK BLANK, REFLECTIVE MASK AND METHOD OF MANUFACTURING SEMICONDUCTOR DEVICE

CROSS REFERENCE TO RELATED APPLICATIONS

This application is a National Stage of International Application No. PCT/JP2018/022756 filed Jun. 14, 2018, which claims priority to Japanese Patent Application No. 2017-121485 filed Jun. 21, 2017, and the contents of which is incorporated by reference in its entirety.

TECHNICAL FIELD

The present disclosure relates to a reflective mask used to manufacture a semiconductor device and a substrate with multilayer reflective film and reflective mask blank used to manufacture a reflective mask. In addition, the present disclosure relates to a method of manufacturing a semiconductor device using the aforementioned reflective mask.

BACKGROUND ART

Accompanying the increasingly higher levels of integration of semiconductor devices in the semiconductor industry in recent years, there is a need for fine patterns that exceed the transfer limitations of conventional photolithography methods using ultraviolet light. Extreme ultraviolet (EUV) lithography is considered to be promising as an exposure technology that uses EUV light to enable the formation of such fine patterns. Here, EUV light refers to light in the wavelength band of the soft X-ray region or vacuum ultraviolet region, and more specifically, light having a wavelength of about 0.2 nm to 100 nm. Reflective masks have been proposed as transfer masks for use in this EUV lithography. Such reflective masks have a multilayer reflective film that reflects exposure light formed on a substrate, and have an absorber film pattern obtained by forming an absorber film that absorbs exposure light in a pattern on the multilayer reflective film.

The reflective mask is manufactured from a reflective mask blank having a substrate, a multilayer reflective film formed on the substrate, and an absorber film formed on the multilayer reflective film. The absorber film pattern is manufactured by forming a pattern of the absorber film by a method such as photolithography.

The substrate with multilayer reflective film is required to have a higher smoothness from the viewpoints of improving defect quality accompanying pattern miniaturization in recent years as well as optical properties required by transfer masks. The multilayer reflective film is formed by alternately building up high refractive index layers and low refractive index layers on the surface of a mask blank substrate. Each of these layers is generally formed by sputtering using a sputtering target comprised of the material used to form these layers.

Ion beam sputtering is preferably carried out for the sputtering method. Since ion beam sputtering does not require the generation of plasma by electrical discharge, there is less likelihood of impurities contaminating the multilayer reflective film, and since the ion source is independent, there is the advantage of setting of conditions being relatively easy. In order to form each layer of a multilayer reflective film having favorable smoothness and planar uniformity, high refractive index layers and low refractive index layers are deposited by allowing the sputtered particles to reach the substrate so as to have a large angle with respect to the normal of the main surface of the mask blank substrate (straight line perpendicular to the aforementioned main surface), or in other words, an angle that is diagonal or nearly parallel to the main surface of the substrate.

As a technology for manufacturing a substrate with multilayer reflective film using such a method, Patent Literature 1 describes that ion beam sputtering is carried out by holding the absolute value of an angle α formed between the normal of the substrate and sputtered particles entering the substrate to 35 degrees a 80 degrees while rotating the substrate centering on the central axis thereof when depositing a multilayer reflective film of a reflective mask blank for EUV lithography on the substrate.

In addition, a multilayer film, in which a substance having a relatively high refractive index and a substance having a relatively low refractive index are alternately layered with the order of several nanometers, is normally used for the aforementioned multilayer reflective film. For example, a multilayer film obtained by alternately layering thin films of Si and Mo is known as that having high reflectance with respect to EUV light of 13 nm to 14 nm. In a reflective mask using such a multilayer reflective film, it is necessary to increase the film density of each layer of the multilayer film in order to obtain high reflectance with respect to short wavelength light. Consequently, the multilayer reflective film inevitably has a high compressive stress.

Patent Literature 2 describes that, after forming a Mo/Si multilayer reflective film, the film stress of the Mo/Si multilayer reflective film can be relieved by carrying out heat treatment for about 30 seconds to about 12 hours at about 100° C. to about 400° C. without impairing the reflective properties of the Mo/Si multilayer reflective film.

PRIOR ART LITERATURE

Patent Literature

Patent Literature 1: JP 2009-510711 A
Patent Literature 2: U.S. Pat. No. 6,309,705 B

DISCLOSURE OF THE DISCLOSURE

Problems to be Solved by the Disclosure

During exposure using a reflective mask, exposure light is absorbed by an absorber film formed in a pattern, and exposure light is reflected by a multilayer reflective film at those portions where the multilayer reflective film is exposed. The reflectance of the multilayer reflective film with respect to exposure light is preferably high in order to obtain high contrast during exposure.

In addition, film stress of the multilayer reflective film can be reduced the higher the heat treatment temperature during heat treatment after the multilayer reflective film has been formed. However, mixing progresses at the interface of each layer composing the Mo/Si multilayer reflective film. If mixing proceeds excessively, the problem occurs in which reflectance of the multilayer reflective film with respect to exposure light decreases. In the case reflectance of the multilayer reflective film with respect to exposure light is sufficiently high, reflectance capable of withstanding use can be maintained even in the case such mixing has occurred.

Therefore, an aspect of the present disclosure is to provide a reflective mask having a multilayer reflective film that has high reflectance with respect to exposure light and little film stress. In addition, an aspect of the present disclosure is to provide a substrate with multilayer reflective film and reflective mask blank used to manufacture a reflective mask having high reflectance with respect to exposure light and little film stress. Moreover, an aspect of the present disclosure is to provide a method of manufacturing a semiconductor device using the aforementioned reflective mask.

Means for Solving the Problems

The inventors of the present disclosure found that, when depositing a multilayer reflective film by ion beam sputtering, reflectance following deposition can be increased by depositing the multilayer reflective film by supplying krypton (Kr) ion particles from the ion source. In addition, the inventors of the present disclosure found that, since the reflectance of the multilayer reflective film used in the present disclosure is high, high reflectance can be maintained even in the case of having relieved film stress by heat treating the multilayer reflective film. The inventors of the present disclosure conceived of the present disclosure on the basis of the above findings.

The present disclosure has the following configurations in order to solve the aforementioned problems.

(Configuration 1)

Configuration 1 of the present disclosure is a substrate with multilayer reflective film provided with a multilayer reflective film for reflecting exposure light, the multilayer reflective film comprising a multilayer film obtained by building up an alternating stack of low refractive index layers and high refractive index layers on a substrate, wherein the multilayer reflective film contains krypton (Kr).

(Configuration 2)

Configuration 2 of the present disclosure is the substrate with multilayer reflective film described in Configuration 1, wherein the krypton (Kr) content of the multilayer reflective film is not more than 3 at %.

(Configuration 3)

Configuration 3 of the present disclosure is the substrate with multilayer reflective film described in Configuration 1 or Configuration 2, wherein the low refractive index layers are molybdenum (Mo) layers, the high refractive index layers are silicon (Si) layers, and the krypton (Kr) content of the low refractive index layers is relatively low in comparison with the high refractive index layers.

(Configuration 4)

Configuration 4 of the present disclosure is the substrate with multilayer reflective film described in any of Configurations 1 to 3 comprising a protective film on the multilayer reflective film.

(Configuration 5)

Configuration 5 of the present disclosure is a reflective mask blank comprising an absorber film on the multilayer reflective film of the substrate with multilayer reflective film described in any of Configurations 1 to 3 or on protective film of the substrate with multilayer reflective film described in Configuration 4.

(Configuration 6)

Configuration 6 of the present disclosure is a reflective mask comprising an absorber pattern, obtained by patterning the absorber film of the reflective mask blank described in Configuration 5, on the multilayer reflective film.

(Configuration 7)

Configuration 7 of the present disclosure is a method of manufacturing a semiconductor device comprising a step for forming a transfer pattern on a transferred substrate by carrying out a lithography process with an exposure device using the reflective mask described in Configuration 6.

Effects of the Disclosure

According to the present disclosure, a method of manufacturing a reflective mask having a multilayer reflective film having high reflectance with respect to exposure light and little film stress, can be provided. In addition, according to the present disclosure, a method of manufacturing a substrate with multilayer reflective film and reflective mask blank used to manufacture a reflective mask having multilayer reflective film having high reflectance with respect to exposure light and little film stress, can be provided. Moreover, according to the present disclosure, a method of manufacturing a semiconductor device using the aforementioned reflective mask can be provided.

MODE FOR CARRYING OUT THE DISCLOSURE

The following provides a detailed explanation of embodiments of the present disclosure with reference to the drawings. Furthermore, the following embodiments are for providing a detailed explanation of the present disclosure, and do not limit the present disclosure to the scope thereof.

Figure 1:
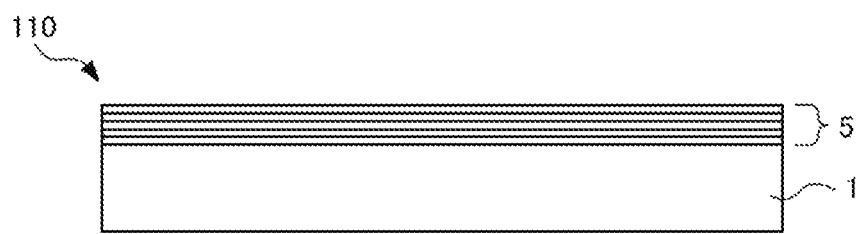
FIG. 1 is a cross-sectional schematic diagram of one example of the substrate with multilayer reflective film of the present disclosure.

As shown in FIG. 1, a substrate with multilayer reflective film 110 of the present disclosure is provided with a multilayer reflective film 5 on a substrate 1. The multilayer reflective film 5 is a film for reflecting exposure light and is comprised of a multilayer film obtained by building up an alternating stack of low refractive index layers and high refractive index layers. The multilayer reflective film in the substrate with multilayer reflective film 110 of the present disclosure is characterized by containing krypton (Kr).

When manufacturing the substrate with multilayer reflective film 110 of the present disclosure, the multilayer reflective film 5 is deposited on the substrate 1 by ion beam sputtering. Ion beam sputtering is carried out by supplying ion particles from an ion source to the target of a high refractive index material and the target of a low refractive index material. The multilayer reflective film 5 is formed by supplying krypton (Kr) ion particles to the targets from the ion source during ion beam sputtering. The Kr ion particles supplied from the ion source collide with the targets and generate sputtered particles of the target materials. A film of a prescribed material can be deposited on the substrate 1 as a result of the sputtered particles accumulating on the surface of the substrate 1.

When the multilayer reflective film 5 is deposited by ion beam sputtering using Kr ion particles, the multilayer reflective film 5 can be obtained that contains Kr and reflectance of the multilayer reflective film 5 with respect to exposure light can be increased. The reason why reflectance can be increased in the case of using Kr ion particles as compared with the case of using Ar ion particles is presumed to be as follows. Since the atomic weight of Kr is closer to that of the material of the low refractive index layers (such as Mo) than Ar, the number of reflected Kr ion particles and/or kinetic energy following collision with the target decreases. Consequently, the Kr content contained in the multilayer reflective film 5 can be made to be less than the Ar content in the case of having used Ar ion particles for the sputtered particles. In the case of having carried out ion beam sputtering, the material of the high refractive index layers (such as Si) ends up being diffused in the low refractive index layers (such as Mo layers) resulting in the formation of metal diffusion layers (such as MoSi diffusion layers). The multilayer reflective film 5 having high reflectance is thought to be able to be obtained since the formation of metal diffusion layers can be inhibited by reducing the content of noble gas contained in the multilayer reflective film 5.

Thus, in the case of having deposited the multilayer reflective film 5 using Kr ion particles, film stress of the multilayer reflective film 5 can be reduced by carrying out heat treatment at a high temperature on the substrate with multilayer reflective film 110 since it becomes difficult to form metal diffusion layers. Thus, the substrate with multilayer reflective film 110 of the present disclosure is able to reduce film stress while maintaining high reflectance of the multilayer reflective film 5.

The reflective mask blank 100 can be manufactured using the substrate with multilayer reflective film 110 of the present disclosure. Use of the substrate with multilayer reflective film 110 of the present disclosure allows the reflective mask blank 100 to be manufactured having the multilayer reflective film 5 having high reflectance with respect to exposure light and little film stress.

Figure 3:
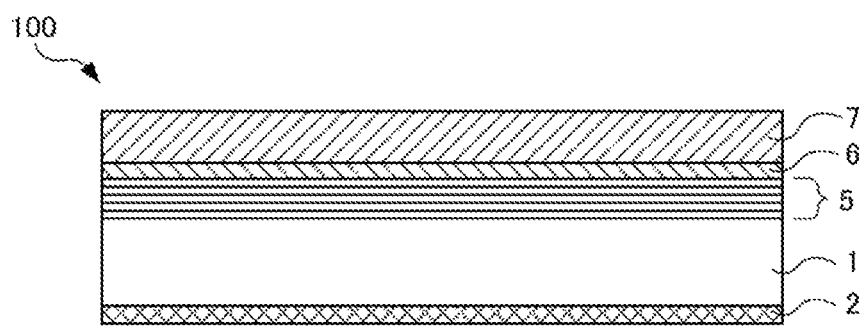
FIG. 3 is a cross-sectional schematic diagram of one example of the reflective mask blank of the present disclosure.

FIG. 3 indicates a cross-sectional schematic diagram of one example of the reflective mask blank 100 of the present disclosure. The reflective mask blank 100 having an absorber film 7 can be formed on the uppermost surface of the substrate with multilayer reflective film 110 (such as the surface of the multilayer reflective film 5 or the protective film 6). Use of the reflective mask blank 100 of the present disclosure allows the obtaining of a reflective mask 200 having the multilayer reflective film 5 having high reflectance with respect to EUV light.

Figure 2:
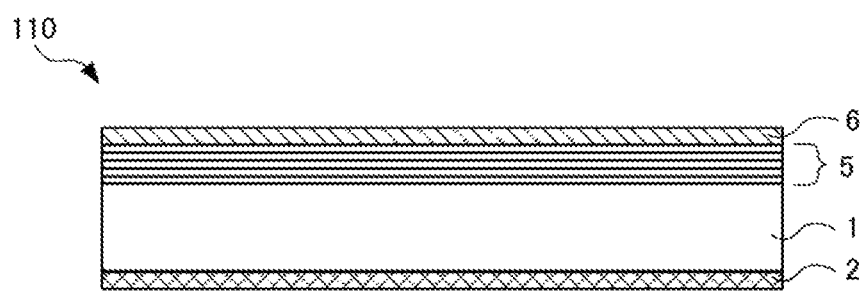
FIG. 2 is a cross-sectional schematic diagram of another example of the substrate with multilayer reflective film of the present disclosure.

In the present description, the "substrate with multilayer reflective film 110" refers to that in which the multilayer reflective film 5 is formed on the prescribed substrate 1. FIGS. 1 and 2 indicate examples of cross-sectional schematic diagrams of the substrate with multilayer reflective film 110. Furthermore, the "substrate with multilayer reflective film 110" includes that in which a thin film other than the multilayer reflective film 5 such as the protective film 6 and/or a back side conductive film 2 is formed. In the present description, the "reflective mask blank 100" refers to that in which the absorber film 7 is formed on the substrate with multilayer reflective film 110. Furthermore, the "reflective mask blank 100" includes that in which a thin film such as an etching mask film or resist film is additionally formed.

In the present description, "arranging (forming) the absorber film 7 on the multilayer reflective film 5" includes not only to the case of the absorber film 7 being arranged (formed) in contact with the surface of the multilayer reflective film 5, but also includes the case of having another film between the multilayer reflective film 5 and the absorber film 7. This applies similarly to other films as well. In addition, in the present description, "arranging film A in contact with the surface of film B" refers to film A and film B being arranged in direct contact without having another film interposed between film A and film B.

<Substrate with Multilayer Reflective Film 110>

The following provides an explanation of the substrate 1 and each film that compose the substrate with multilayer reflective film 110 of the present disclosure.

<<Substrate 1>>

The substrate 1 in the substrate with multilayer reflective film 110 of the present disclosure is required to prevent the occurrence of absorber pattern strain caused by heat generated during EUV exposure. Consequently, a substrate having a low coefficient of thermal expansion within the range of 0±5 ppb/° C. is preferably used for the substrate 1. Examples of materials, that can be used, having a low coefficient of thermal expansion within this range include $SiO_2$—$TiO_2$-based glass, multicomponent glass ceramics, and the like.

The surface of a first main surface on the side where a transfer pattern (composed by the absorber film 7 to be subsequently described) of the substrate 1 is formed is processed so at to have a prescribed degree of flatness from the viewpoint of at least obtaining pattern transfer accuracy and positional accuracy. In the case of EUV exposure, the degree of flatness in a 132 mm×132 mm region of the main surface on the side where the transfer pattern of the substrate 1 is formed is preferably not more than 0.1 µm, more preferably not more than 0.05 µm and even more preferably not more than 0.03 µm. In addition, the second main surface (back side) on the opposite side from the side where the absorber film 7 is formed is a surface that is electrostatically chucked when placed in an exposure apparatus. The degree of flatness in a 132 mm×132 mm region of the second main surface is preferably not more than 0.1 µm, more preferably not more than 0.05 µm and even more preferably not more than 0.03 µm. Furthermore, the degree of flatness of the second main surface of the reflective mask blank 100 in a 142 mm×142 mm region is preferably not more than 1 µm, more preferably not more than 0.5 µm and even more preferably not more than 0.3 µm.

In addition, the height of surface smoothness of the substrate 1 is also an extremely important parameter. Surface roughness of the first main surface where the transfer absorber film pattern is formed in terms of the root mean square roughness (Rms) is preferably not more than 0.15 nm and more preferably not more than 0.10 nm. Furthermore, surface smoothness can be measured with an atomic force microscope.

Moreover, the substrate 1 preferably has high rigidity in order to prevent deformation of a film (such as the multilayer reflective film 5) formed on the substrate 1 caused by film stress. In particular, the substrate 1 preferably has a high Young's modulus of not less than 65 GPa.

<<Base Film>>

The substrate with multilayer reflective film 110 of the present disclosure can have a base film in contact with the surface of the substrate 1. The base film is a thin film formed between the substrate 1 and the multilayer reflective film 5.

As a result of having this base film, in addition to preventing accumulation of charge during mask pattern defect inspections carried out using an electron beam, high surface smoothness with few phase defects in the multilayer reflective film 5 can be obtained.

A material containing ruthenium or tantalum as the main component thereof is preferably used for the material of the base film. For example, the material may consist of Ru metal alone or Ta metal alone, or may be an Ru alloy or Ta alloy containing a metal such as titanium (Ti), niobium (Nb), molybdenum (Mo), zirconium (Zr), yttrium (Y), boron (B), lanthanum (La), cobalt (Co) and/or rhenium (Re) and the like in Ru or Ta. The film thickness of the base film is preferably within the range of 1 nm to 10 nm, for example.

<<Multilayer Reflective Film 5>>

The multilayer reflective film 5 imparts the function of reflecting EUV light in the reflective mask 200. The multilayer reflective film 5 is a multilayer film obtained by alternately building up layers respectively having elements of different refractive indices as the main components thereof.

In general, a multilayer film obtained by alternately layering about 40 to 60 cycles of a thin film of a light element or compound thereof that is a high refractive index material (high refractive index layer), and a thin film of a heavy element or compound thereof that is a low refractive index material (low refractive index layer), is used for the multilayer reflective film 5.

The multilayer film used as the multilayer reflective film 5 may be obtained by building up a high refractive index layer and a low refractive index layer in this order from the substrate 1 side for a plurality of cycles, with one cycle consisting of a stack of a high refractive index layer/low refractive index layer, or the multilayer film may be obtained by building up a low refractive index layer and high refractive index layer in that order starting from the side of the substrate 1 for a plurality of cycles, with one cycle consisting of a stack of low refractive index layer/high refractive index layer. Furthermore, the uppermost layer of the multilayer reflective film 5, namely the uppermost layer of the multilayer reflective film 5 on the opposite side from the substrate 1 side, is preferably a high refractive index layer. In the aforementioned multilayer film, in the case of building up a high refractive index layer and a low refractive index layer in this order from the substrate 1 side for a plurality of cycles, with one cycle consisting of a stack of a high refractive index layer/low refractive index layer, the uppermost layer becomes a low refractive index layer. In this case, if a low refractive index layer composes the uppermost surface of the multilayer reflective film 5, the uppermost surface ends up being easily oxidized and reflectance of the reflective mask 200 decreases. Consequently, the multilayer reflective film 5 preferably has a high refractive index layer additionally formed on the low refractive index layer of the uppermost layer. On the other hand, in the aforementioned multilayer film, in the case of building up a low refractive index layer and high refractive index layer in that order starting from the side of the substrate 1 for a plurality of cycles, with one cycle consisting of a stack of low refractive index layer/high refractive index layer, the uppermost layer becomes a high refractive index layer. Thus, it is not necessary to additionally form a high refractive index layer in this case.

A layer containing silicon (Si) can be used as a high refractive index layer. A Si compound containing boron (B), carbon (C), nitrogen (N) and/or oxygen (O) in addition to Si can be used as a material containing Si. The use of a high refractive index layer containing Si allows the obtaining of the reflective mask 200 having superior reflectance with respect to EUV light. In addition, a metal selected from molybdenum (Mo), ruthenium (Ru), rhodium (Rh) and platinum (Pt), or an alloy thereof, can be used as a low refractive index layer. In the substrate with multilayer reflective film 110 of the present disclosure, the low refractive index layers are preferably molybdenum (Mo) layers and the high refractive index layers are preferably silicon (Si) layers. For example, a Mo/Si cyclically layered film, obtained by alternately building up about 40 to 60 cycles of Mo layers and Si layers, is preferably used for the multilayer reflective film 5 in order to reflect EUV light having a wavelength of 13 nm to 14 nm. Furthermore, the high refractive index layer serving as the uppermost layer of the multilayer reflective film 5 can be formed with silicon (Si) and a silicon oxide layer containing silicon and oxygen can be formed between the uppermost layer (Si) and the protective film 6. Mask cleaning resistance can be improved in the case of this structure.

The multilayer reflective film 5 contains krypton (Kr). In this case, the formation of a metal diffusion layer is inhibited and reflectance can be increased in comparison with the case of ion beam sputtering using Ar ion particles. The Kr content in the multilayer reflective film 5 is preferably not more than 3 at % and more preferably not more than 1.5 at %. In addition, the ratio of Kr content to Si content is preferably not more than 0.06 and more preferably not more than 0.03. If the Kr content is excessively high, reflectance decreases thereby making this undesirable.

In addition, in the case the low refractive index layers are Mo layers and the high refractive index layers are Si layers, the Kr content of the Mo layers is relatively low in comparison with the Si layers. In the case the Kr content of the Mo layers is low, surface roughness of the Mo layers can be inhibited from increasing, and as a result thereof, surface roughness of the uppermost layer of the multilayer reflective film 5 can be inhibited from increasing. The Kr content of the Mo layers may be not less than 0.5 at % lower than, or not less than 1 at % lower than the Kr content of the Si layers. In addition, the Mo layers can have a polycrystalline structure and the Si layers can have an amorphous structure.

The Kr content of the low refractive index layers or high refractive index layers can be changed by adjusting parameters of the supplied amount of Kr ion particles during ion beam sputtering of each layer, or the acceleration voltage and incident angle (angle formed by the normal of the substrate and the sputtered particles entering the substrate) of the Kr ion particles. For example, by making the incident angle during deposition of the Mo layers to be less than the incident angle during deposition of the Si layers, the Kr content of the Mo layers can be made to be less than the Kr content of the Si layers.

The incident angle during deposition of the low refractive index layers and high refractive index layers is preferably 0° to 40°. If the incident angle exceeds 40°, although thickness of the metal diffusion layer can be reduced, in-plane uniformity of film thickness worsens and in-plane uniformity of reflectance is impaired. Consequently, the incident angle preferably does not exceed 40°. As a result of depositing the multilayer reflective film 5 using Kr ion particles, the thickness of the metal diffusion layer can be reduced even in the case the incident angle of the low refractive index layers and high refractive index layers is made to be 0° to 40°. For example, in the case the low refractive index layers are Mo layers and the high refractive index layers are Si layers, film thickness of the MoSi diffusion layer can be made to be not more than 1.2 nm.

Reflectance of the multilayer reflective film 5 alone is normally not less than 65% and the upper limit thereof is normally 73%. Furthermore, the film thickness and cycle of each constituent layer of the multilayer reflective film 5 can be suitably selected according to the exposure wavelength. More specifically, the film thickness and cycle of each constituent layer of the multilayer reflective film 5 can be selected by satisfying Bragg's law of reflection. Although a plurality high refractive index layers and low refractive index layers are each present in the multilayer reflective film 5, the film thicknesses of the high refractive index layers or the film thicknesses of low refractive index layers are not necessarily required to be the same. In addition, the film thickness of the Si layer of the uppermost surface of the multilayer reflective film 5 can be adjusted within a range that does not cause a decrease in reflectance. The film thickness of the Si uppermost surface (high refractive index layer) can be from 3 nm to 10 nm.

Figure 5:
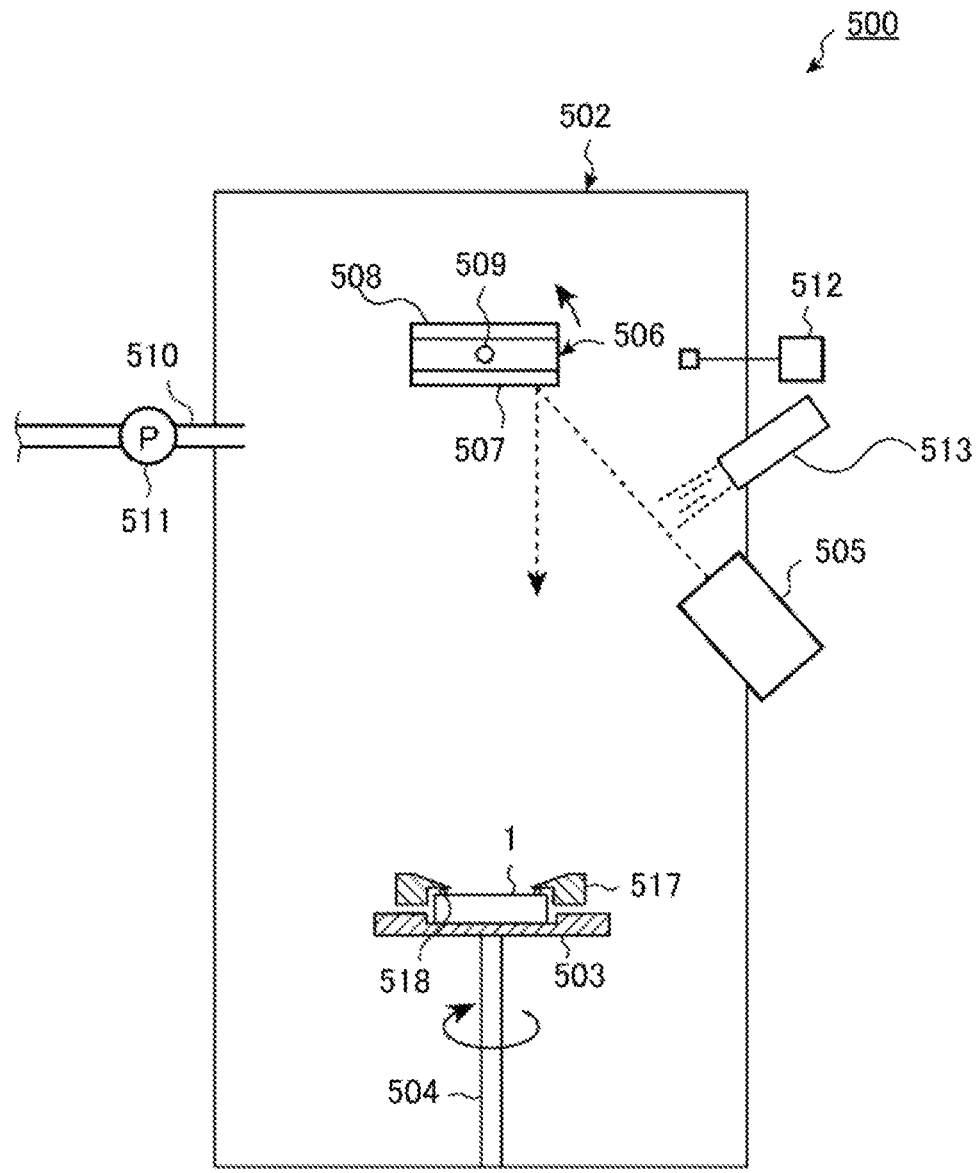
FIG. 5 is a schematic diagram of the internal structure of an ion beam sputtering apparatus.

When manufacturing the substrate with multilayer reflective film 110 of the present disclosure, the multilayer reflective film 5 is deposited on the substrate 1 by ion beam sputtering. FIG. 5 indicates a schematic diagram of the internal structure of an ion beam sputtering apparatus 500. More specifically, ion beam sputtering is carried out by supplying ion particles from an ion source to a target of a high refractive index material and a target of a low refractive index material. In the case the multilayer reflective film 5 is a Mo/Si cyclically layered multilayer film, for example, a Si layer having a film thickness of about 4 nm is first deposited on the substrate 1 using a Si target by ion beam sputtering. Subsequently, a Mo layer having a film thickness of about 3 nm is deposited using a Mo target. With the deposition of this Si layer and Mo layer defined as one cycle, Si layers and Mo layers are built up for 40 to 60 cycles to form the multilayer reflective film 5 (having a Si layer for the layer of the uppermost surface).

Next, an explanation is provided of the ion beam sputtering apparatus 500 able to be used in the present disclosure with reference to FIG. 5.

As schematically shown in FIG. 5, the ion beam sputtering apparatus 500 able to be used in the present disclosure is provided with a roughly rectangular vacuum chamber 502. A substrate holder 503 is arranged by means of a holder attachment rod 504 on one of the short sides of the vacuum chamber 502 (wall surface having the lower side of FIG. 5 as one side thereof; to suitably be referred to as the "lower short side" to facilitate the explanation). The substrate holder 503 is composed so as to be able to rotate while holding the substrate 1, the details of which will be subsequently described. In addition, the substrate holder 503 is provided with a top clamp 517 provided with presser pins 518 on the corners thereof. After being arranged on the substrate holder 503, the substrate 1 is clamped by the top clamp 517 in a form such that the corners of the main surface of the substrate 1 are pressed with the presser pins 518. In addition to having the function of holding the substrate 1 together with the substrate holder 503, the top clamp 517 also functions as a shield for film adhesion to the lateral surface of the substrate 1. The material of the top clamp 517 is preferably an insulating material such as a material made of resin from the viewpoint of pressing on the substrate 1 and inhibiting the generation of dust. Moreover, among these resins, a material having comparatively high hardness, such as a polyimide-based resin, is particularly preferable.

In addition, a base 506, which appears roughly rectangular when viewed from overhead, is arranged in opposition to the substrate holder 503 in the vicinity of the other short side of the vacuum chamber 502 (wall surface having the upper side of FIG. 5 as one side thereof; to suitably be referred to as the "upper short side" to facilitate the explanation). A first sputtering target 507 is arranged on one of the long sides of the base 506 (surface including one of the long sides), and a second sputtering target 508 is arranged on the other long side of the base 506 (surface including the other long side). A metal, alloy, nonmetal or compound thereof can be used for the materials composing the first sputtering target 507 and the second sputtering target 508 in order to deposit a thin film having prescribed optical properties in a mask blank. Examples of the aforementioned prescribed optical properties include reflectance and transmittance, and the like. The multilayer reflective film 5 obtained by building up a stack of alternating layers of a high refractive index material and a low refractive index material can be formed by using this ion beam sputtering apparatus 500. In this case, a high refractive index material comprised of Si or a Si compound can be used for the material composing the first sputtering target 507. In addition, a low refractive index material such as Mo, Nb, Ru or Rh, or the like can be used for the material composing the second sputtering target 508. Here, an explanation is provided of the case of using a silicon (Si) material for the first sputtering target 507 and using a molybdenum (Mo) material for the second sputtering target 508. In addition, a rotating shaft 509 is arranged in the center of the base 506 and the base 506 is composed so as to be able to integrally rotate with the rotating shaft 509.

A supply/discharge path 510 having a vacuum pump 511 arranged therein is connected to one of the long sides of the vacuum chamber 502 (wall surface having the left side of FIG. 5 as one side thereof; to be suitably referred to as the "left long side"). In addition, a valve (not shown) is provided in the supply/discharge path 510 that is able to open and close freely.

A pressure sensor 512 for measuring pressure within the vacuum chamber 502 and an ion source 505 for supplying ionized particles are respectively arranged in the other long side of the vacuum chamber 502 (wall surface having the right side of FIG. 5 as one side thereof; to be suitably referred to as the "right long side"). The ion source 505 is connected to a plasma gas supply means (not shown) and ion particles (krypton ions) of the plasma gas are supplied from this plasma gas supply means. In addition, the ion source 505 is arranged so as to oppose the base 506 and is composed so that ion particles supplied from the plasma gas supply means are supplied to either the sputtering target 507 or sputtering target 508 of the base 506.

In addition, a neutralizer 513 is provided in order to supply electrons for neutralizing ion particles from the ion source 505. The neutralizer 513 is provided with an electron supply source (not shown) that supplies electrons by extracting electrons from a prescribed gas plasma, and is composed so as to radiate electrons towards the course traveled by the ion particles as they approach the sputtering target 507 or 508 from the ion source 505. Furthermore, not all ion particles are necessarily neutralized by the neutralizer 513. Consequently, in the present description, the term "ion particles ($Kr^+$ particles)" is also used for ion particles ($Kr^+$ particles) partially neutralized by the neutralizer 513.

Each of the components such as the holder attachment rod 504, the ion source 505, the rotating shaft 509, the vacuum pump 511 and the pressure sensor 512 is connected to a control apparatus (not shown) and is composed so that the operation thereof is controlled by this control apparatus.

The following provides an explanation of a method of forming the multilayer reflective film 5 using the ion beam sputtering apparatus 500 provided with the configuration described above.

First, the vacuum pump 511 is operated to discharge gas from inside the vacuum chamber 502 through the supply/discharge path 510. Operation then waits until the pressure within the vacuum chamber 502 measured with the pressure sensor 512 reaches a prescribed degree of vacuum (degree of vacuum not having an effect on the properties of the film formed, such as a degree of vacuum of $10^{-8}$ Torr ($1.33 \times 10^{-6}$ Pa).

Next, the substrate 1 serving as the substrate for thin film formation is introduced into the vacuum chamber 502 by means of a robot arm (not shown) and is housed in the opening of the substrate holder 503 so as to expose the main surface of the substrate 1. The substrate 1 arranged on the substrate holder 503 is clamped by the top clamp 517 in a form in which the corners of the main surface of the substrate 1 are pressed with the presser pins 518.

Furthermore, a prescribed vacuum state is maintained within a chamber housing the robot arm (not shown) adjacent to the vacuum chamber 502. Consequently, the aforementioned vacuum state can be maintained within the vacuum chamber 502 even when introducing the substrate 1.

Plasma gas (krypton gas) is then introduced into the vacuum chamber 502 from the plasma gas supply means by means of the ion source 505. At this time, the degree of vacuum of the vacuum chamber 502 is controlled so as to be held at a preferable degree of vacuum for carrying out sputtering of $10^{-4}$ Torr to $10^{-2}$ Torr ($1.33 \times 10^{-2}$ Pa to 1.33 Pa).

Ionized particles (namely, $Kr^+$ particles) from the ion source 505 are supplied to the first sputtering target 507 arranged on the base 506. These particles collide with the first sputtering target 507 and beat out (sputter) silicon particles composing the target 507 from the surface thereof and these silicon particles are made to adhere to the main surface of the substrate 1. During this process, ionized particles ($Kr^+$ particles) are neutralized by operating the neutralizer 513. In this process, the rod 504 of the substrate holder 503 and the rotating shaft 509 of the base 506 are controlled by the control apparatus so that the rod 504 of the substrate holder 503 rotates at a prescribed rate of rotation and so that the angle of inclination of the first sputtering target 507 fluctuates within a fixed range. As a result, a silicon film can be uniformly deposited on the main surface of the substrate 1.

Following completion of deposition of the silicon film, the rotating shaft 509 of the base 506 is rotated roughly 180° and the second sputtering target 508 is positioned in opposition to the main surface of the substrate 1. $Kr^+$ particles are then supplied from the ion source 505 to the second sputtering target 508 arranged on the base 506. Molybdenum particles composing the target 508 are beaten out (sputtered) from the surface thereof by the $Kr^+$ particles and the molybdenum particles are made to adhere to the silicon film surface deposited on the main surface of the substrate 1. During this process, ionized particles ($Kr^+$ particles) are neutralized by operating the neutralizer 513. In addition, similar to the deposition processing of the aforementioned silicon film, a molybdenum film can be deposited at a uniform thickness on the silicon film deposited on the substrate 1 by controlling the rod 504 of the substrate holder 503 and the rotating shaft 509. The multilayer reflective film 5, having a prescribed reflectance with respect to exposure light in the form of EUV light and comprised by alternately layering silicon films and molybdenum films, is obtained by repeatedly carrying out deposition process of these silicon film and molybdenum film for a prescribed number of times (such as 40 to 60 times).

In the present disclosure, by supplying krypton (Kr) ion particles from an ion source to a target during ion beam sputtering for forming the multilayer reflective film 5 as described above, the multilayer reflective film 5, containing Kr, having a small metal diffusion layer, and demonstrating high reflectance with respect to exposure light, can be formed on the substrate 1.

<<Protective Film 6>>

As shown in FIG. 2, the protective film 6 is preferably formed on the multilayer reflective film 5 in the substrate with multilayer reflective film 110 of the present disclosure. As a result of forming the protective film 6 on the multilayer reflective film 5, damage to the surface of the multilayer reflective film 5 can be inhibited when manufacturing the reflective mask 200 using the substrate with multilayer reflective film 110. Consequently, reflectance properties of the resulting reflective mask 200 with respect to EUV light become favorable.

The protective film 6 is formed on the multilayer reflective film 5 in order to protect the multilayer reflective film 5 from dry etching and cleaning in the manufacturing process of the reflective mask 200 to be subsequently described. In addition, the protective film 6 is also provided with the function of protecting the multilayer reflective film 5 when repairing opaque defects in the mask pattern using an electron beam (EB). Here, FIG. 2 indicates the case of the protective film 6 consisting of a single layer. However, the protective film 6 can have a stack of not less than 3 layers, the lowermost layer and the uppermost layer can be layers comprised of substances containing Ru, for example, and a metal other than Ru or an alloy can be interposed between the lowermost layer and the uppermost layer. The protective film 6 is formed by, for example, a material containing ruthenium as the main component thereof. Examples of materials containing ruthenium as the main component thereof include Ru metal, Ru alloys containing a metal such as titanium (Ti), niobium (Nb), molybdenum (Mo), zirconium (Zr), yttrium (Y), boron (B), lanthanum (La), cobalt (Co) and/or rhenium (Re) in addition to Ru, and materials containing nitrogen therein. Among these, the protective film 6 comprised of an Ru-based material containing Ti is used particularly preferably. In this case, the phenomenon by which silicon, which is a constituent element of the multilayer reflective film 5, diffuses from the surface of the multilayer reflective film 5 into the protective film 6 can be inhibited. Consequently, there is little surface roughening during mask cleaning and there is less susceptibility to the occurrence of film separation. Since reduction of surface roughening is directly connected to prevention of decreased reflectance of the multilayer reflective film 5 with respect to EUV exposure light, this reduction of surface roughening is important for improving exposure efficiency of EUV exposure and improving throughput.

The content ratio of Ru in an Ru alloy used in the protective film 6 is not less than 50 at % to less than 100 at %, preferably not less than 80 at % to less than 100 at % and more preferably not less than 95 at % to less than 100 at %. In the case the content ratio of Ru in an Ru alloy is not less than 95 at % to less than 100 at % in particular, diffusion of the constituent element (silicon) of the multilayer reflective film 5 into the protective film 6 can be suppressed. In addition, the protective film 6 in this case can be provided with mask cleaning resistance, an etching stopper function during etching processing of the absorber film 7, and a function that prevents changes over time in the multilayer reflective film 5 while adequately ensuring reflectance of EUV light.

In the case of EUV lithography, it is not technically easy to provide an EUV pellicle that prevents adhesion of foreign matter to the mask pattern surface since there are few substances that are transparent with respect to exposure light. Thus, pellicle-less applications not using a pellicle have become commonplace. In addition, during EUV lithography, exposure contamination occurs in which a carbon film accumulates or an oxide film grows on the mask due to EUV exposure. Consequently, it is necessary to frequently carrying out cleaning to remove foreign matter and contaminants on the mask at the stage at which the mask is used to manufacture a semiconductor device. Thus, an EUV reflecting-type mask 200 is required to have a level of mask cleaning resistance that is order of magnitude greater than that of light-transmitting masks for photolithography. Use of the protective film 6 comprised of an Ru-based material containing Ti makes it possible to increase cleaning resistance particularly with respect to cleaning solutions containing sulfuric acid, sulfuric acid hydrogen peroxide mixture (SPM), ammonia, ammonium hydrogen peroxide mixture (APM), OH radical cleaning solutions and ozonated water having a concentration of not more than 10 ppm, thereby satisfying the requirement of mask cleaning resistance.

There are no particular limitations on the film thickness of the protective film 6 provided it is able to fulfill the functions of the protective film 6. From the viewpoint of reflectance of EUV light, film thickness of the protective film 6 is preferably 1.0 nm to 8.0 nm and more preferably 1.5 nm to 6.0 nm.

A known film formation method can be used to form the protective film 6 without any particular restrictions. Specific examples of methods used to form the protective film 6 include sputtering and ion beam sputtering.

<Heat Treatment>

As was previously described, although film stress of the multilayer reflective film 5 can be reduced the higher the heat treatment temperature during heat treatment (annealing) following formation of the multilayer reflective film 5, this results in the problem of a decrease in reflectance of the multilayer reflective film 5 with respect to EUV light. Therefore, the degree to which film stress of the multilayer reflective film 5 of the substrate with multilayer reflective film 110 can be reduced was evaluated by measuring the degree of flatness while changing the annealing temperature between the case of using krypton (Kr) ion particles and the case of using argon (Ar) ion particles when depositing the multilayer reflective film 5 by ion beam sputtering.

According to a method complying with Example 1 to be subsequently described, the multilayer reflective film 5 was formed and the substrate with multilayer reflective film 110 was fabricated experimentally by supplying krypton (Kr) ion particles from the ion source 505 and carrying out ion beam sputtering when depositing the multilayer reflective film 5 (Sample 1). In addition, the multilayer reflective film 5 was formed and the substrate with multilayer reflective film 110 was fabricated experimentally under the same conditions as Sample 1 with the exception of supplying argon (Ar) ion particles from the ion source during ion beam sputtering (Sample 2).

The annealing temperature was set to 150° C., 200° C., 240° C. and 280° C. in the case of Sample 1 using Kr ion particles and set to 180° C., 200° C., 210° C. and 220° C. in the case of Sample 2 using Ar ion particles. Following annealing of Sample 1 and Sample 2, the degree of flatness and reflectance with respect to EUV light of the multilayer reflective film 5 were measured. Measurement of the degree of flatness of the multilayer reflective layer 5 of the substrate with multilayer reflective film 110 was carried out using a flatness measuring apparatus (Tropel Corp., UltraFlat 200) and evaluated based on TIR at a 132 mm square region within the deposition area of the multilayer reflective film 5. The results are shown in FIG. 6.

Figure 6:
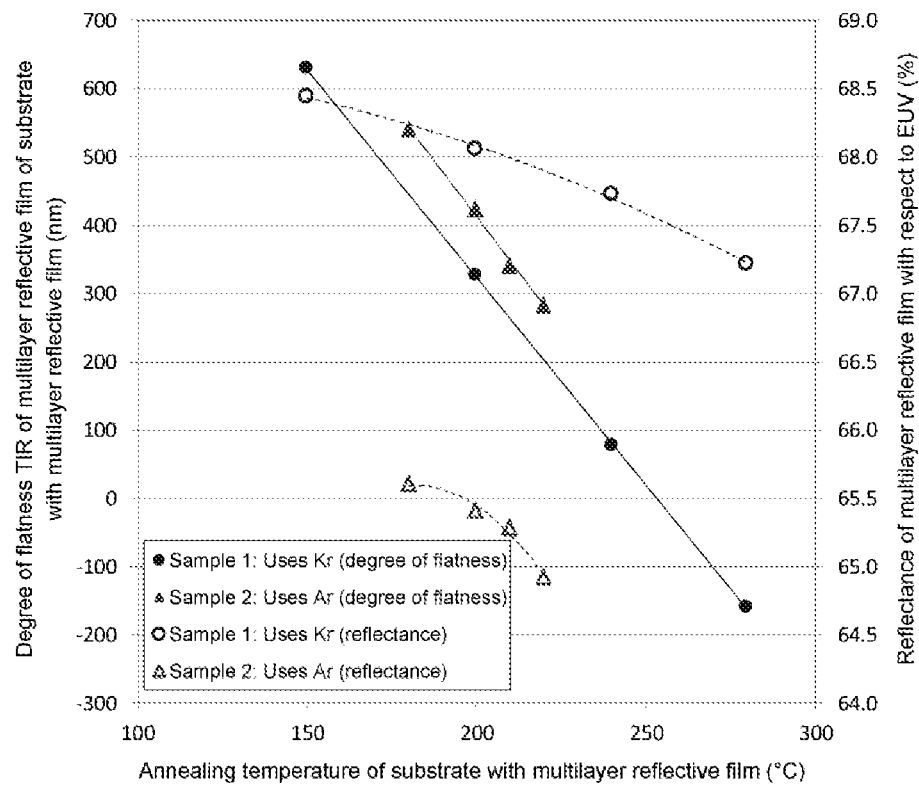
FIG. 6 is a graph indicating the degree of flatness and EUV light reflectance versus annealing temperature of a substrate with multilayer reflective film manufactured using Kr or Ar.

As can be understood from FIG. 6, in the case of using Sample 1 using Kr ion particles, the decrease in reflectance accompanying increases in annealing temperature was gradual, and reflectance demonstrated a high value of 67.2% even at an annealing temperature of 280° C. In addition, TIR was 0 nm in the vicinity of an annealing temperature of 250° C. On the other hand, in the case of Sample 2 using Ar ion particles, reflectance at an annealing temperature of 200° C. was 65.4%, demonstrating a lower value than in the case of Sample 1 using Kr ion particles, and reflectance decreased rapidly at 210° C. or more, exhibiting a value of 64.9% at 220° C. In addition, TIR at an annealing temperature of 220° C. was 283 nm, and the annealing temperature at which TIR reaches 0 nm is presumed to be higher than in the case of Sample 1.

As a result, it was determined that film stress of the multilayer reflective film 5 can be made to be zero by adjusting the annealing temperature in the case of using Kr ion particles. In addition, the use of Kr ion particles instead of Ar ion particles during ion beam sputtering was determined to make it possible to improve annealing resistance of the multilayer reflective film 5 and maintain high reflectance even after annealing.

Heat treatment (annealing) is carried out at 150° C. to 300° C., and preferably 200° C. to 280° C., on the substrate with multilayer reflective film 110 in the state in which the multilayer reflective film 5 has been formed thereon on, or in the state in which the protective film 6 has been formed on the multilayer reflective film 5. As a result of this annealing, in addition to relieving stress and being able to prevent decreases in the degree of flatness caused by stress and strain on the mask blank, changes over time in EUV reflectance of the multilayer reflective film 5 can be prevented. In addition, as a result of annealing the aforementioned substrate with multilayer reflective film 110 at not lower than 210° C., film stress can be reduced to zero while maintaining high reflectance.

Since the multilayer reflective film 5 formed on the substrate with multilayer reflective film 110 of the present disclosure demonstrates high reflectance with respect to EUV light, even if the substrate with multilayer reflective film 110 is subjected to heat treatment, reflectance of the multilayer reflective film 5 can be maintained to a degree that is capable of withstanding use as the reflective mask 200.

<Reflective Mask Blank 100>

The following provides an explanation of the reflective mask blank 100 of the present disclosure.

<<Absorber Film 7>>

The reflective mask blank 100 has the absorber film 7 on the previously described substrate with multilayer reflective film 110. Namely, the absorber film 7 is formed on the multilayer reflective film 5 (or on the protective film 6 in the case of having formed the protective film 6). The basic function of the absorber film 7 is to absorb EUV light. The absorber film 7 may be the absorber film 7 used for the purpose of absorbing EUV light or may be the absorber film 7 having a phase shift function in consideration of a phase shift of EUV light. The absorber film 7 having a phase shift function refers to that which absorbs EUV light while also reflecting a portion thereof to cause the phase to shift. Namely, in the reflective mask 200 with a patterned absorber film 7 having a phase shift function, the absorber film 7 reduces the amount of EUV light by absorbing that EUV light while reflecting a portion of the light at a level that does not have a detrimental effect on pattern transfer at that portion where the absorber film 7 is formed. In addition, EUV light is reflected from the multilayer reflective film 5 through the protective film 6 at the region (field) where the absorber film 7 is not formed. Consequently, there is a desired phase difference between reflected light from the absorber film 7 having a phase shift function and reflected light from the field. The absorber film 7 having a phase shift function is formed so that the phase difference between light reflected from the absorber film 7 and light reflected from the multilayer reflective film 5 is from 170 degrees to 190 degrees. The contrast of projected optical images improves as a result of light having a phase difference inverted in the vicinity of 180 degrees mutually interfering at the pattern edge. Resolution increases accompanying this improvement in image contrast thereby making it possible to increase various tolerances relating to exposure such as exposure level tolerance and focus tolerance.

Figure 4A:
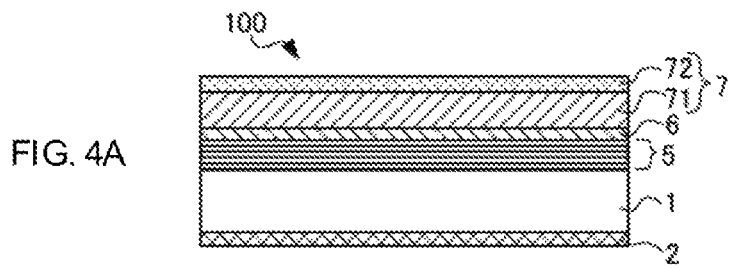
FIGS. 4A-4E are process drawings showing the method of manufacturing the reflective mask of the present disclosure with cross-sectional schematic diagrams.

The absorber film 7 may be a single-layer film or a multilayer film comprised of a plurality of films (such as lower layer absorber film 71 and upper layer absorber film 72) as shown in FIG. 4A. A single-layer film is characterized by being able to reduce the number of steps during mask blank manufacturing and increase production efficiency. In the case of a multilayer film, the optical constants and film thickness of the upper layer absorber film 72 can be suitably set so that the upper layer absorber film 72 serves as an antireflective film during mask pattern inspections using light. As a result, inspection sensitivity during mask pattern inspections using light improves. In addition, stability over time improves if a film that is obtained by adding oxygen (O) or nitrogen (N), which improve oxidation resistance, is used to the upper layer absorber film 72. In this manner, various functions can be added by using a multilayer film for the absorber film 7. In the case the absorber film 7 has a phase shift function, desired reflectance can be easily obtained since the range of optical adjustments can be increased through the use of a multilayer film.

There are no particular limitations on the material of the absorber film 7 provided it has a function that absorbs EUV light and enables etching and other processing (preferably etching by dry etching with a chlorine (Cl)-based or fluorine (F)-based gas). Tantalum (Ta) alone or a tantalum compound containing Ta as the main component thereof can be preferably used as a material having such functions.

The absorber film 7 comprised of tantalum or a tantalum compound, or the like, as described above can be formed by magnetron sputtering such as DC sputtering and RF sputtering. For example, the absorber film 7 can be deposited by reactive sputtering using a target containing tantalum and boron and using argon gas to which oxygen or nitrogen has been added.

The tantalum compound used to form the absorber film 7 contains a Ta alloy. In the case the absorber film 7 is a Ta alloy, the crystalline state of the absorber film 7 preferably has an amorphous or microcrystalline structure from the viewpoints of smoothness and flatness. Edge roughness of an absorber pattern 7a may increase and pattern dimensional accuracy may worsen if the surface of the absorber film 7 is not smooth and flat. Preferable surface roughness of the absorber film 7 in terms of root mean square roughness (Rms) is preferably not more than 0.5 nm, more preferably not more than 0.4 nm, and even more preferably not more than 0.3 nm.

Examples of tantalum compounds that can be used to form the absorber film 7 include compounds containing Ta and B, compounds containing Ta and N, compounds containing Ta, O and N, compounds containing Ta and B and further containing at least any of O and N, compounds containing Ta and Si, compounds containing Ta, Si and N, compounds containing Ta and Ge, and compounds containing Ta, Ge and N.

Ta has a large absorption coefficient with respect to EUV light and is a material that can easily be dry-etched with chlorine-based gas and fluorine-based gas. Consequently, it could be said that Ta can be a material for an absorber film 7 having superior processability. Moreover, an amorphous material can be easily obtained by adding B, Si and/or Ge and the like to Ta. As a result, smoothness of the absorber film 7 can be improved. In addition, since the addition of N and/or 0 to Ta improves resistance to oxidation of the absorber film 7, the effect of being able to improve stability over time is obtained.

The upper layer absorber film 72 becomes an antireflective film during mask pattern defect inspections using light by using an absorber film 7 of a multilayer film comprised of the lower layer absorber film 71 composed of TaBN and the upper layer absorber film 72 composed of TaBO and making the film thickness of the TaBO of the upper layer absorber film 72 to be about 14 nm. Consequently, inspection sensitivity during mask pattern defect inspections can be increased.

In addition, examples of materials composing the absorber film 7 include chromium and chromium compounds, such as Cr, CrN, CrCON, CrCO, CrCOH and CrCONH, along with materials such as WN, TiN or Ti in addition to tantalum and tantalum compounds.

<<Back Side Conductive Film 2>>

The back side conductive film 2 for electrostatic chucking is formed on the second main surface (back side) of the substrate 1 (opposite side of the side where the multilayer reflective film 5 is formed, or on an intermediate layer in the case an intermediate layer such as a hydrogen permeation inhibitory film is formed on the substrate 1). Sheet resistance required of the back side conductive film 2 for electrostatic chucking is normally not more than 100Ω/□. Examples of methods used to form the back side conductive film 2 include magnetron sputtering or ion beam sputtering using the target of a metal such as chromium or tantalum or an alloy thereof. The material of the back side conductive film 2 containing chromium (Cr) is preferably a Cr compound containing Cr along with at least one element selected from boron, nitrogen, oxygen and carbon. Examples of Cr compounds include CrN, CrON, CrCN, CrCON, CrBN, CrBON, CrBCN, CrBOCN, and the like. The material of the back side conductive film 2 containing tantalum (Ta) preferably uses tantalum (Ta), an alloy containing Ta, or a Ta compound containing at least one of boron, nitrogen, oxygen and carbon in addition thereto. Examples of Ta compounds include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, TaSiCON, and the like. Although there are no particular limitations on the film thickness of the back side conductive film 2 provided it satisfies the function of being able to be used for electrostatic chucking, it is normally from 10 nm to 200 nm. In addition, this back side conductive film 2 is also provided with a function that adjusts stress on the side of the second main surface of the reflective mask blank 100. Namely, the back side conductive film 2 is adjusted to allow the obtaining of a flat reflective mask blank 100 by achieving balance with stress from each type of film formed on the side of the first main surface.

Furthermore, the back side conductive film 2 can be formed on the substrate with multilayer reflective film 110 prior to forming the aforementioned absorber film 7. In this case, the substrate with multilayer reflective film 110 provided with the back side conductive film 2 can be obtained as shown in FIG. 2.

<Other Thin Films>

The substrate with multilayer reflective film 110 and the reflective mask blank 100 manufactured according to the manufacturing method of the present disclosure can be provided with a hard mask film for etching (also referred to as an "etching mask film") and/or a resist film on the absorber film 7. Examples of typical materials of the hard mask film for etching include silicon (Si) and materials obtained by adding oxygen (O), nitrogen (N), carbon (C) and/or hydrogen (H) to silicon (Si), or chromium (Cr) and materials obtained by adding oxygen (O), nitrogen (N), carbon (C) and/or hydrogen (H) to chromium. Specific examples include $SiO_2$, SiON, SiN, SiO, Si, SiC, SiCO, SiCN, SiCON, Cr, CrN, CrO, CrON, CrC, CrCO, CrCN, CrOCN, and the like. However, in the case the absorber film 7 is a compound that contains oxygen, it is preferable to avoid using materials containing oxygen (such as $SiO_2$) for the hard mask film for etching from the viewpoint of etching resistance. In the case of having formed the hard mask film for etching, the film thickness of the resist film can be reduced, which is advantageous with respect to pattern miniaturization.

The substrate with multilayer reflective film 110 and reflective mask blank 100 of the present disclosure is preferably provided with a hydrogen permeation inhibitory film, which inhibits permeation of hydrogen from the substrate 1 to the back side conductive film 2, between a glass substrate serving as the substrate 1 and the back side conductive film 2 containing tantalum or chromium. The presence of this hydrogen permeation inhibitory film makes it possible to inhibit hydrogen from being incorporated in the back side conductive film 2, thereby making it possible to inhibit increases in compressive stress of the back side conductive film 2.

The material of the hydrogen permeation inhibitory film may be any type of material provided it is a material that is resistant to the permeation of hydrogen and is able to inhibit permeation of hydrogen from the substrate 1 to the back side conductive film 2. Specific examples of materials of the hydrogen permeation inhibitory film include Si, $SiO_2$, SiON, SiCO, SiCON, SiBO, SiBON, Cr, CrN, CrON, CrC, CrCN, CrCO, CrCON, Mo, MoSi, MoSiN, MoSiO, MoSiCO, MoSiON, MoSiCON, TaO, TaON, and the like. The hydrogen permeation inhibitory film may be a single layer of these materials or may be a multilayer and composition gradient film.

<Reflective Mask 200>

The present disclosure is the reflective mask 200 having the absorber film pattern 7a on the multilayer reflective film 5 obtained by patterning the absorber film 7 of the previously described reflective mask blank 100. Use of the reflective mask blank 100 of the present disclosure allows the obtaining of the reflective mask 200 having the multilayer reflective film 5 demonstrating high reflectance with respect to EUV light and little film stress.

The reflective mask 200 is manufactured by using the reflective mask blank 100 of the present embodiment. Only a general explanation is provided here, with details being explained in the subsequent examples with reference to the drawings.

After preparing the reflective mask 100, a resist film 8 (not required in the case of being provided with a resist film in the form of the reflective mask blank 100) is formed on the uppermost surface of the first main surface thereof (to be referred to as the absorber film 7 as will be explained in the following examples) and a circuit pattern or other desired pattern is drawn (exposed) on this resist film 8 followed by development and rinsing to form a prescribed resist pattern 8a.

The absorber pattern 7a is formed by dry etching the absorber film 7 using this resist pattern 8a as a mask. Furthermore, an etching gas selected from a chlorine-based gas such as $Cl_2$, $SiCl_4$ and $CHCl_3$, a mixed gas containing a chlorine-based gas and $O_2$ at a prescribed ratio, a mixed gas containing a chlorine-based gas and He at a prescribed ratio, a mixed gas containing a chlorine-based gas and Ar at a prescribed ratio, a fluorine-based gas such as $CF_4$, $CHF_3$, $C_2F_6$, $C_3F_6$, $C_4F_6$, $C_4F_8$, $CH_2F_2$, $CH_3F$, $C_3F_8$, $SF_6$ and $F_2$, and a mixed gas containing a fluorine-based gas and $O_2$ at a prescribed ratio, and the like can be used for the etching gas. Here, surface roughening occurs on the Ru-based protective film 6 if oxygen is contained in the etching gas at the final stage of etching. Consequently, an etching gas not containing oxygen is used preferably at the stage of over-etching when the Ru-based protective film 6 is exposed to etching.

Subsequently, the resist pattern 8a is removed by ashing and resist stripping solution to fabricate the absorber pattern 7a having a desired circuit pattern formed thereon.

The reflective mask 200 of the present disclosure can be obtained by going through the aforementioned process.

<Method of Manufacturing Semiconductor Device>

The present disclosure is a method of manufacturing a semiconductor device having a step for carrying out a lithography process using an exposure apparatus and forming a transfer pattern on a transferred substrate using the aforementioned reflective mask 200. According to the method of manufacturing a semiconductor device of the present disclosure, a semiconductor device having a fine and highly precise transfer pattern can be manufactured since the reflective mask 200 can be used that has the multilayer reflective film 5 demonstrating high reflectance with respect to EUV light and little film stress.

More specifically, a desired transfer pattern can be formed on a semiconductor substrate by carrying out EUV exposure using the reflective mask 200 of the aforementioned present embodiment. A semiconductor device having a desired electronic circuit formed thereon can be manufactured at high yield by going through this lithography step in addition to various other steps such as etching of the processed film, formation of an insulating film and conductive film, introduction of a dopant and annealing.

EXAMPLES

The following provides an explanation of various examples with reference to the drawings.

Example 1

The substrate with multilayer reflective film 110 having the multilayer reflective film 5 formed on one main surface of the substrate 1 was fabricated for Example 1, as shown in FIG. 1. Fabrication of the substrate with multilayer reflective film 110 of Example 1 was carried out in the manner indicated below.

((Substrate 1))

A low thermal expansion glass substrate in the form of a 6025 size $SiO_2$—$TiO_2$-based glass substrate measuring about 152 mm×152 mm×6.35 mm, in which both the first main surface and second main surface were polished, was prepared as the substrate 1. Polishing consisting of a coarse polishing step, precision polishing step, local processing step and touch polishing step was carried out so as to obtain a flat and smooth main surface.

((Multilayer Reflective Film 5))

The multilayer reflective film 5 was formed on the first main surface of the aforementioned substrate 1 using the ion beam sputtering apparatus 500 shown in FIG. 5. This multilayer reflective film 5 was in the form of a cyclically layered multilayer reflective film 5 comprised of Si and Mo in order to obtain the multilayer reflective film 5 suitable for EUV exposure at a wavelength of 13.5 nm. More specifically, an Si target and an Mo target were used as a high refractive index material target and low refractive index material target (first and second sputtering targets 507 and 508). Krypton (Kr) ion particles were supplied from the ion source 505 to these targets 507 and 508 followed by building up an alternating stack of Si layers and Mo layers on the substrate 1 by carrying out ion beam sputtering.

Here, the Si and Mo sputtered particles were made to enter at an angle of 30 degrees to the normal of the main surface of the substrate 1. First, a Si layer was deposited at a film thickness of 4.2 nm followed by depositing a Mo layer at a film thickness of 2.8 nm. With this deposition of one layer each comprising one cycle, building up layers was similarly carried out for 40 cycles followed by finally depositing a Si layer at a film thickness of 4.0 nm to form the multilayer reflective film 5. Thus, the material of the lowermost layer of the multilayer reflective film 5, namely the material of the multilayer reflective film 5 closest to the substrate 1, is Si, and the material of the uppermost layer of the multilayer reflective film 5, namely the material of the multilayer reflective film 5 in contact with the protective film 6, is Si. Furthermore, although building up layers was carried out for 40 cycles here, the number of cycles is not limited thereto, but rather building up layers may also be carried out for 60 cycles, for example. In the case of building up layers for 60 cycles, although the number of step increases in comparison with 40 cycles, reflectance with respect to EUV light can be enhanced.

When depositing the multilayer reflective film 5, krypton was used as a gas for activating the neutralizer 513. Thus, the only gas that is introduced into the chamber during ion beam sputtering is krypton. The krypton is plasmatized in the neutralizer 513 and electrons are extracted from the plasma. Electrons are extracted so as to be irradiated towards the course traveled by the ion particles that approach the sputtering targets 507 and 508 from the ion source 505.

The substrate with multilayer reflective film 110 of Example 1 was manufactured in the manner described above.

Reflectance was measured for the substrate with multilayer reflective film 110 of Example 1. As shown in Table 1, reflectance at a wavelength of 13.5 nm was 68.4%. In addition, the degree of flatness of the multilayer reflective film 5 of the substrate with multilayer reflective film 110 of Example 1 was 900 nm as shown in Table 1 when measured using a flatness measuring apparatus (Tropel Corp., Ultra-Flat 200).

Figure 7:
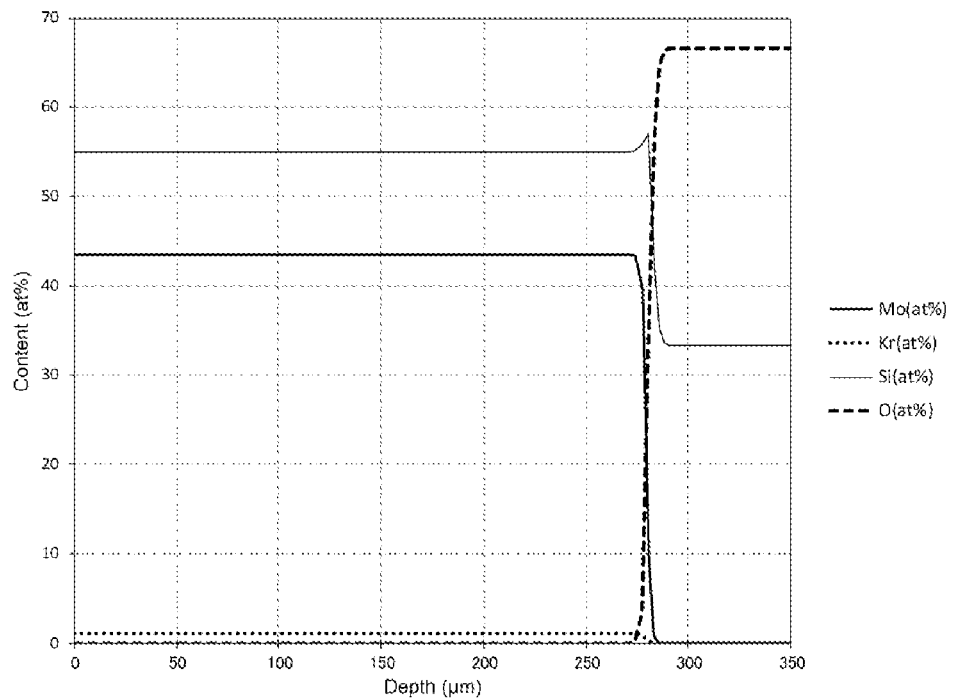
FIG. 7 is a graph indicating the results of analyzing the multilayer reflective film of Example 1 by Rutherford backscattering analysis.

In addition, the composition of the multilayer reflective film 5 when measured by Rutherford backscattering analysis was such that the Kr content was 1.1 at %, Mo content was 43.6 at % and Si content was 55.3 at % as shown in FIG. 7. The ratio of the Kr content to the Si content was 0.02. In addition, when analyzed by X-ray photoelectron spectroscopy, Kr was determined to be contained in the Si layers, and Kr was hardly contained in the Mo layers. Moreover, when a cross-section of the multilayer reflective film 5 was observed with a transmission electron microscope, the Mo layers were determined to have a polycrystalline structure and the Si layers were determined to have an amorphous structure. In addition, when the thickness of the metal diffusion layer was measured by X-ray reflectance measurement, the thickness of the MoSi diffusion layer on the Si layers formed when Mo particles were incident on the Si layers was 1.1 nm.

Next, the substrate with multilayer reflective film 110 of Example 1 was annealed for 10 minutes at 230° C. Subsequently, the reflectance of the substrate with multilayer reflective film 110 of Example 1 was measured again. As shown in Table 1, reflectance at a wavelength of 13.5 nm following annealing was 67.7%. In addition, as shown in Table 1, measurement of the degree of flatness of the multilayer reflective film 5 of the substrate with multilayer reflective film 110 of Example 1 after annealing yielded a degree of flatness of 350 nm. In addition, there was hardly any change in the composition of the multilayer reflective film 5 following annealing.

Example 2

The substrate with multilayer reflective film 110 having the multilayer reflective film 5 formed on the first main surface of the substrate 1 was manufactured in the same manner as Example 1 for Example 2 as shown in Table 1.

The substrate with multilayer reflective film 110 of Example 2 was annealed in the same manner as Example 1 with the exception of changing the annealing temperature to 200° C. In addition, reflectance and degree of flatness of the multilayer reflective film 5 were measured before and after annealing. The results of those measurements are shown in Table 1.

Example 3

The substrate with multilayer reflective film 110 having the multilayer reflective film 5 formed on the first main surface of the substrate 1 was manufactured in the same manner as Example 1 for Example 3 as shown in Table 1.

The substrate with multilayer reflective film 110 of Example 3 was annealed in the same manner as Example 1 with the exception of changing the annealing temperature to 260° C. In addition, reflectance and degree of flatness of the multilayer reflective film 5 were measured before and after annealing. The results of those measurements are shown in Table 1.

Example 4

The substrate with multilayer reflective film 110 having the multilayer reflective film 5 formed on the first main surface of the substrate 1 was manufactured in the same manner as Example 1 for use as Example 4 with the exception of changing the incident angle of Si sputtered particles to 25 degrees.

Measurement of degree of flatness and reflectance of the substrate with multilayer reflective film 110 in the same manner as Example 1 yielded reflectance of 68.4% and a degree of flatness of 850 nm.

In addition, when the composition of the multilayer reflective film 5 was measured by Rutherford backscattering analysis, Kr content was 1.0 at %, Mo content was 43.6 at % and Si content was 55.4 at %. The ratio of the Kr content to the Si content was 0.02. In addition, when analyzed by X-ray photoelectron spectroscopy, Kr was determined to be contained in the Si layers, and Kr was hardly contained in the Mo layers. Moreover, observation of a cross-section of the multilayer reflective film 5 with a transmission electron microscope revealed that the Mo layers had a polycrystalline structure and the Si layers had an amorphous structure. In addition, when the thickness of the metal diffusion layer was measured by X-ray reflectance measurement, the thickness of the MoSi diffusion layer on the Si layers formed when Mo particles were incident on the Si layers was 1.15 nm.

Next, the substrate with multilayer reflective film 110 was annealed (heat treated) for 10 minutes at a temperature of 230° C. in the same manner as Example 1. Subsequently, when reflectance and degree of flatness of the substrate with multilayer reflective film 110 of Example 5 were measured, reflectance was 67.7% and degree of flatness was 330 nm. In addition, there was hardly any change in the composition of the multilayer reflective film 5 following annealing.

Comparative Example 1

The substrate with multilayer reflective film 110 having the multilayer reflective film 5 formed on the first main surface of the substrate 1 was manufactured for Comparative Example 1 with the exception of using argon ions as ion particles from the ion source and using argon as the gas for activating the neutralizer 513 during deposition of the multilayer reflective film 5 as shown in Table 1. Namely, krypton was not used when depositing the multilayer reflective film 5 of Comparative Example 1.

When the composition of the multilayer reflective film 5 was measured by Rutherford backscattering analysis, Ar content was 1.3 at %, Mo content was 43.7% and Si content was 55.0 at %. In addition, when the thickness of the metal diffusion layer was measured by X-ray reflectance measurement, the thickness of the MoSi diffusion layer on the Si layers was 1.3 nm.

The substrate with multilayer reflective film 110 of Comparative Example 1 was annealed in the same manner as Example 1. In addition, reflectance and degree of flatness of the multilayer reflective film 5 were measured before and after annealing. Those measurement results are shown in Table 1.

(Evaluation Results of Substrates with Multilayer

Reflective Film 110 of Examples 1 to 4 and
Comparative Example 1

In Examples 1 and 4, the thickness of the metal diffusion layer was 1.1 nm and 1.15 nm, respectively, which was less than the thickness of 1.3 nm of the metal diffusion layer of Comparative Example 1. In addition, as is clear from Table 1, in the case of the substrates with multilayer reflective film 110 of Examples 1 to 4 having the multilayer reflective film containing Kr formed by supplying Krypton ions from the ion source 505, a high value was able to be obtained for reflectance, demonstrating reflectance of the multilayer reflective film 5 before annealing of 68.4%. In contrast, reflectance of the multilayer reflective layer 5 of the substrate with multilayer reflective film 110 of Comparative Example 1 before annealing was low at 66.0%. In addition, reflectance values of the multilayer layer films 5 of Examples 1 to 4 after annealing were not less than 67.5%, which were higher than the reflectance of the multilayer reflective film 5 of Comparative Example 1 before annealing. In addition, in Example 3, reflectance was higher than Comparative Example 1 and degree of flatness was also higher at 500 nm. On the basis of the above, in the case of the substrates with multilayer reflective film 110 of Examples 1 to 4, in addition to being able to reduce the thickness of the metal diffusion layer, reduce film stress of the multilayer reflective film 5 by annealing, and improve the degree of flatness of the substrate with multilayer reflective film 110, reflectance of the multilayer reflective substrate 5 was clearly determined to be able to be maintained to a degree that is capable of withstanding use as the reflective mask 200.

(Reflective Mask Blank 100)

The reflective mask blank 100 can be manufactured using the aforementioned substrates with multilayer reflective film 110 of Examples 1 to 4. The following provides an explanation of the method of manufacturing the reflective mask blank 100.

((Protective Film 6))

The protective film 6 was formed on the surface of the aforementioned substrate with multilayer reflective film 110. The protective film 6 comprised of Ru was deposited at a film thickness of 2.5 nm by ion beam sputtering using an Ru target in an Ar gas atmosphere. Here, the Ru sputtered particles were made to enter at an angle of 30 degrees to the normal of the main surface of the substrate 1. Annealing was subsequently carried out at 130° C. in air.

(Absorber Film 7)

Next, a TaBN film having a film thickness of 56 nm as the lower layer absorber film 71 and a TaBO film having a film thickness of 14 nm as the upper layer absorber film 72 were built up in layers by DC sputtering to form the absorber film 7 comprised of this two-layer film. The TaBN film was formed by reactive sputtering in a mixed gas atmosphere of Ar gas and $N_2$ gas using TaB for the target. The TaBO film was formed by reactive sputtering in a mixed gas atmosphere of Ar gas and $O_2$ gas using TaB for the target. In addition to the TaBO film demonstrating little change over time, the TaBO film of this film thickness acts as an antireflective film during mask pattern inspections using light, thereby improving inspection sensitivity. A method that combines the use of a mask pattern inspection using light is frequently used in relation to throughput even in the case of carrying out mask pattern inspections with an electron beam (EB). Namely, mask pattern inspections with EB having high inspection sensitivity are carried out on regions where fine patterns like memory cells are used, while mask pattern inspections using light having high throughput are carried out for regions composed with comparatively large patterns like indirect peripheral circuits.

((Back Side Conductive Film 2))

Next, the back side conductive film 2 comprised of CrN was formed under the following conditions by magnetron sputtering (reactive sputtering) on the second main surface (back side) of the substrate 1. Formation conditions of the back side conductive film 2 consisted of the use of a Cr target, mixed gas atmosphere of Ar and $N_2$ (Ar: 90 at %, $N_2$: 10 at %) and film thickness of 20 nm.

The reflective mask blank 100 was manufactured in the manner described above using the substrates with multilayer reflective film 110 of Examples 1 to 4.

(Reflective Mask 200)

Next, the reflective mask 200 was manufactured using the aforementioned reflective mask blanks 100 of Examples 1 to 4. The following provides an explanation of manufacturing of the reflective mask 200 with reference to FIGS. 4A-4E.

Figure 4B:
Figure 4C:
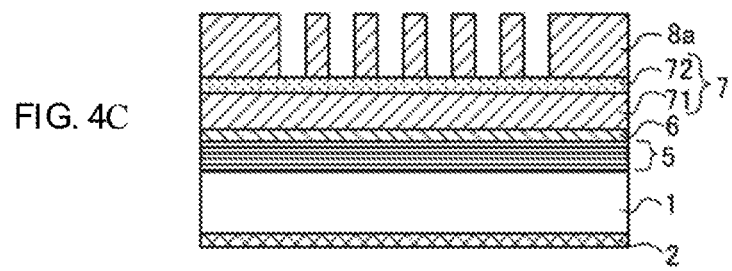
Figure 4D:
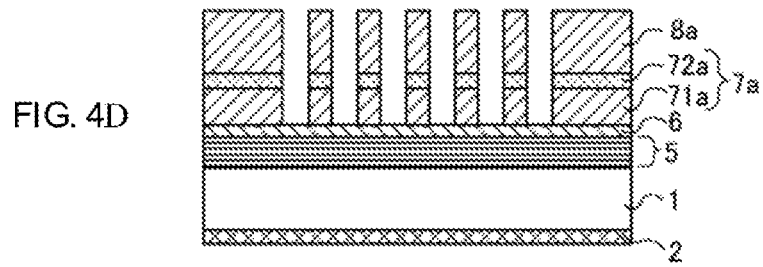
Figure 4E:
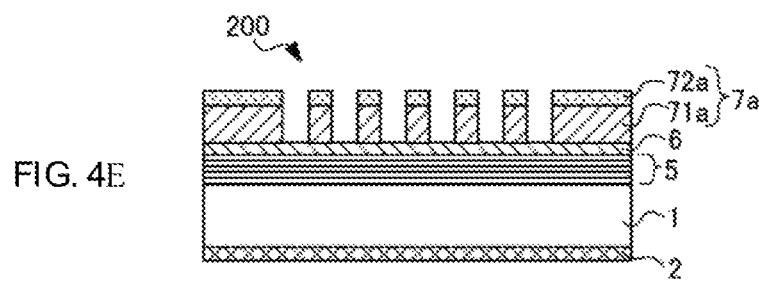

First, as shown in FIG. 4B, the resist film 8 was formed on the upper layer absorber film 72 of the reflective mask blank 100. A circuit pattern or other desired pattern was then drawn (exposed) in this resist film 8 followed by development and rinsing to form the prescribed resist pattern 8a (FIG. 4C). Next, the TaBO film (the upper layer absorber film 72) was etched using the resist pattern 8a as a mask using $CF_4$ gas followed by dry etching the TaBN film (the lower layer absorber film 71) using $Cl_2$ gas to form an absorber pattern 7a (FIG. 4D). The protective film 6 comprised of Ru has extremely high dry etching resistance to $Cl_2$ gas and serves as an adequate etching stopper. Subsequently, the resist pattern 8a was removed by ashing or resist stripping solution.

The reflective masks 200 of Examples 1 to 4 were manufactured in the manner described above.

(Manufacturing of Semiconductor Device)

The reflective masks 200 manufacturing using the substrates with multilayer reflective film 110 of Examples 1 to 4 were placed in an EUV scanner, EUV exposure was carried out on a wafer having a processed film and resist film formed on a semiconductor substrate. A resist pattern was formed on the semiconductor substrate having the processed film formed thereon by developing this exposed resist film.

Since the reflective masks 200 manufactured using the substrates with multilayer reflective film 110 of Examples 1 to 4 have the multilayer reflective film 5 having high reflectance with respect to exposure light, a fine and highly precise transfer pattern was able to be formed.

A semiconductor device having desired properties was able to be manufactured at high yield by transferring this resist pattern to a processed film by dry etching and going through various other steps such as the formation of an insulating film and conductive film, introduction of a dopant and annealing.

TABLE 1

|  | Example 1 | Example 2 | Example 3 | Example 4 | Comparative Example 1 |
| --- | --- | --- | --- | --- | --- |
| Ion particles from ion source | Kr ions | Kr ions | Kr ions | Kr ions | Ar ions |
| Reflectance after deposition and before annealing (%) | 68.4% | 68.4% | 68.4% | 68.4% | 66.0% |
| Degree of flatness after deposition and before annealing | 900 nm | 900 nm | 900 nm | 850 nm | 900 nm |
| Annealing temperature after deposition (° C.) | 230° C. | 200° C. | 260° C. | 230° C. | 230° C. |
| Reflection after annealing (%) | 67.7% | 68.0% | 67.5% | 67.7% | 64.5% |
| Degree of flatness after annealing | 350 nm | 450 nm | 50 nm | 330 nm | 350 nm |

BRIEF DESCRIPTION OF REFERENCE SYMBOLS

1 Substrate
2 Back side conductive film
5 Multilayer reflective film
6 Protective film
7 Absorber film
7a Absorber pattern
8 Resist film
8a Resist pattern
71 Absorber film (lower layer absorber film)
71a Absorber pattern (lower layer absorber pattern)
72 Absorber film (upper layer absorber film)
72a Absorber pattern (upper layer absorber pattern)
100 Reflective mask blank
110 Substrate with reflective mask blank
200 Reflective mask
500 Ion beam sputtering apparatus
502 Vacuum chamber
503 Substrate holder
504 Holder attachment rod
505 Ion source
506 Base
507 First sputtering target
508 Second sputtering target
509 Rotating shaft
510 Supply/discharge path
511 Vacuum pump
512 Pressure sensor
513 Neutralizer
517 Top clamp
518 Presser pin

The invention claimed is:

1. A substrate with multilayer reflective film comprising:
a substrate; and
on the substrate, a multilayer reflective film configured to reflect exposure light, the multilayer reflective film comprising a stack of layers, the stack comprising low refractive index layers alternating with high refractive index layers,
wherein the multilayer reflective film contains krypton (Kr).

2. The substrate with multilayer reflective film according to claim 1, wherein the krypton (Kr) content of the multilayer reflective film is not more than 3 atomic %.

3. The substrate with multilayer reflective film according to claim 1, wherein the low refractive index layers are molybdenum (Mo) layers, the high refractive index layers are silicon (Si) layers, and
the krypton (Kr) content of the low refractive index layers is relatively low in comparison with the krypton (Kr) content of the high refractive index layers.

4. The substrate with multilayer reflective film according to claim 1, comprising a protective film on the multilayer reflective film.

5. The substrate with multilayer reflective film according to claim 1, wherein the low refractive index layers are molybdenum (Mo) layers, the high refractive index layers are silicon (Si) layers, and wherein, in the multilayer reflective film, the ratio of krypton (Kr) content in atomic % to silicon (Si) content in atomic % is not more than 0.06.

6. The substrate with multilayer reflective film according to claim 1, wherein the low refractive index layers are molybdenum (Mo) layers, the high refractive index layers are silicon (Si) layers, and wherein, in the multilayer reflective film, a thickness of a MoSi diffusion layer is not more than 1.2 nm.

7. A reflective mask blank comprising:

a substrate;

on the substrate, a multilayer reflective film configured to reflect exposure light, the multilayer reflective film comprising a stack of layers, the stack comprising low refractive index layers alternating with high refractive index layers; and an absorber film on the multilayer reflective film, wherein the multilayer reflective film contains krypton (Kr).

8. The reflective mask blank according to claim 7, wherein the krypton (Kr) content of the multilayer reflective film is not more than 3 atomic %.

9. The reflective mask blank according to claim 7, wherein the low refractive index layers are molybdenum (Mo) layers, the high refractive index layers are silicon (Si) layers, and the krypton (Kr) content of the low refractive index layers is relatively low in comparison with the krypton (Kr) content of the high refractive index layers.

10. The reflective mask blank according to claim 7, wherein the low refractive index layers are molybdenum (Mo) layers, the high refractive index layers are silicon (Si) layers, and wherein, in the multilayer reflective film, the ratio of krypton (Kr) content in atomic % to silicon (Si) content in atomic % is not more than 0.06.

11. The reflective mask blank according to claim 7, wherein the low refractive index layers are molybdenum (Mo) layers, the high refractive index layers are silicon (Si) layers, and wherein, in the multilayer reflective film, a thickness of a MoSi diffusion layer is not more than 1.2 nm.

12. The reflective mask blank according to claim 7, comprising a protective film on the multilayer reflective film.

13. A reflective mask comprising:

a substrate;

on the substrate, a multilayer reflective film configured to reflect exposure light, the multilayer reflective film comprising a stack of layers, the stack comprising low refractive index layers alternating with high refractive index layers; and an absorber pattern on the multilayer reflective film, wherein the multilayer reflective film contains krypton (Kr).

14. The reflective mask according to claim 13, wherein the krypton (Kr) content of the multilayer reflective film is not more than 3 atomic %.

15. The reflective mask according to claim 13, wherein the low refractive index layers are molybdenum (Mo) layers, the high refractive index layers are silicon (Si) layers, and the krypton (Kr) content of the low refractive index layers is relatively low in comparison with the krypton (Kr) content of the high refractive index layers.

16. The reflective mask according to claim 13, wherein the low refractive index layers are molybdenum (Mo) layers, the high refractive index layers are silicon (Si) layers, and wherein, in the multilayer reflective film, the ratio of krypton (Kr) content in atomic % to silicon (Si) content in atomic % is not more than 0.06.

17. The reflective mask according to claim 13, wherein the low refractive index layers are molybdenum (Mo) layers, the high refractive index layers are silicon (Si) layers, and wherein, in the multilayer reflective film, a thickness of a MoSi diffusion layer is not more than 1.2 nm.

18. The reflective mask according to claim 13, comprising a protective film on the multilayer reflective film.

19. A method of manufacturing a semiconductor device comprising forming a transfer pattern on a transferred substrate by carrying out a lithography process with an exposure device using the reflective mask according to claim 6.

* * * * *